United States Patent
Lau et al.

(10) Patent No.: US 11,869,815 B2
(45) Date of Patent: Jan. 9, 2024

(54) ASYMMETRY CORRECTION VIA ORIENTED WAFER LOADING

(71) Applicant: Applied Materials, Inc., Santa Clara, CA (US)

(72) Inventors: Eric Lau, Santa Clara, CA (US); Charles C. Garretson, Monterey, CA (US); Huanbo Zhang, San Jose, CA (US); Zhize Zhu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/696,813

(22) Filed: Mar. 16, 2022

(65) Prior Publication Data
US 2022/0208621 A1    Jun. 30, 2022

Related U.S. Application Data

(62) Division of application No. 16/552,456, filed on Aug. 27, 2019, now Pat. No. 11,282,755.

(51) Int. Cl.
*H01L 21/66* (2006.01)
*B25J 9/16* (2006.01)
(Continued)

(52) U.S. Cl.
CPC ............ *H01L 22/26* (2013.01); *B24B 37/30* (2013.01); *B24B 49/12* (2013.01); *B25J 9/1628* (2013.01);
(Continued)

(58) Field of Classification Search
CPC ............... H01L 22/26; H01L 21/30625; H01L 21/67219; H01L 21/67253;
(Continued)

(56) References Cited

U.S. PATENT DOCUMENTS 5,036,015 A   7/1991   Sandhu et al.
5,069,002 A   12/1991  Sandhu et al.
(Continued)

FOREIGN PATENT DOCUMENTS

CN   103537976   1/2014
JP   2016-059991  4/2016
(Continued)

OTHER PUBLICATIONS

International Search Report and Written Opinion in International Appln. No. PCT/US2020/047806, dated Dec. 1, 2020, 11 pages.
(Continued)

*Primary Examiner* — Ahmed N Sefer
(74) *Attorney, Agent, or Firm* — Fish & Richardson P.C.

(57) ABSTRACT

A method for chemical mechanical polishing includes receiving an angular removal profile for a carrier head and an angular thickness profile of a substrate. Prior to polishing the substrate, a desired angle of the carrier head relative to the substrate is selected for loading the substrate into the carrier head. Selecting the desired angle is performed based on a comparison of the angular removal profile for the carrier head and the angular thickness profile of the substrate to reduce angular non-uniformity in polishing. The carrier head is rotated to receive the substrate at the desired angle, the substrate is transferred to the carrier head and loaded in the carrier head with the carrier head at the desired angle relative to the substrate, and the substrate is polished.

13 Claims, 3 Drawing Sheets

(51) Int. Cl.
  *H01L 21/306* (2006.01)
  *H01L 21/67* (2006.01)
  *H01L 21/687* (2006.01)
  *B24B 37/30* (2012.01)
  *B24B 49/12* (2006.01)

(52) U.S. Cl.
  CPC .. *H01L 21/30625* (2013.01); *H01L 21/67219* (2013.01); *H01L 21/67253* (2013.01); *H01L 21/68707* (2013.01); *H01L 22/20* (2013.01); *H01L 22/12* (2013.01)

(58) Field of Classification Search
  CPC ... H01L 21/68707; H01L 22/20; H01L 22/12; B24B 37/30; B24B 49/12; B25J 9/1628; B25J 11/0095
  See application file for complete search history.

(56) References Cited

U.S. PATENT DOCUMENTS

| | | | |
|---|---|---|---|
| 5,081,796 A | 1/1992 | Schultz | |
| 5,222,329 A | 6/1993 | Yu | |
| 5,240,552 A | 8/1993 | Yu et al. | |
| 5,413,941 A | 5/1995 | Koos et al. | |
| 5,439,551 A | 8/1995 | Meikle et al. | |
| 5,486,129 A | 1/1996 | Sandhu et al. | |
| 5,618,447 A | 4/1997 | Sandhu | |
| 5,643,048 A | 7/1997 | Iyer | |
| 5,643,060 A | 7/1997 | Sandhu et al. | |
| 5,658,183 A | 8/1997 | Sandhu et al. | |
| 5,663,797 A | 9/1997 | Sandhu | |
| 5,700,180 A | 12/1997 | Sandhu et al. | |
| 5,738,562 A | 4/1998 | Doan et al. | |
| 5,762,537 A | 6/1998 | Sandhu et al. | |
| 5,777,739 A | 7/1998 | Sandhu et al. | |
| 5,842,909 A | 12/1998 | Sandhu et al. | |
| 5,851,135 A | 12/1998 | Sandhu et al. | |
| 5,855,804 A | 1/1999 | Walker | |
| 5,910,846 A | 6/1999 | Sandhu et al. | |
| 5,936,733 A | 8/1999 | Sandhu et al. | |
| 5,997,384 A | 12/1999 | Blalock | |
| 6,007,408 A | 12/1999 | Sandhu | |
| 6,028,669 A | 2/2000 | Tzeng | |
| 6,046,111 A | 4/2000 | Robinson | |
| 6,075,606 A | 6/2000 | Doan | |
| 6,108,092 A | 8/2000 | Sandhu | |
| 6,120,347 A | 9/2000 | Sandhu | |
| 6,183,345 B1 | 2/2001 | Kamono et al. | |
| 6,184,571 B1 | 2/2001 | Moore | |
| 6,190,234 B1 | 2/2001 | Swedek et al. | |
| 6,190,494 B1 | 2/2001 | Dow | |
| 6,191,864 B1 | 2/2001 | Sandhu | |
| 6,206,754 B1 | 3/2001 | Moore | |
| 6,206,769 B1 | 3/2001 | Walker | |
| 6,208,425 B1 | 3/2001 | Sandhu et al. | |
| 6,213,845 B1 | 4/2001 | Elledge | |
| 6,213,848 B1 | 4/2001 | Campbell et al. | |
| 6,230,069 B1 | 5/2001 | Campbell et al. | |
| 6,234,878 B1 | 5/2001 | Moore | |
| 6,247,998 B1 | 6/2001 | Wiswesser et al. | |
| 6,261,151 B1 | 7/2001 | Sandhu et al. | |
| 6,287,879 B1 | 9/2001 | Gonzales et al. | |
| 6,290,572 B1 | 9/2001 | Hofmann | |
| 6,301,006 B1 | 10/2001 | Doan | |
| 6,306,009 B1 | 10/2001 | Sandhu et al. | |
| 6,319,093 B1 | 11/2001 | Lebel et al. | |
| 6,319,420 B1 | 11/2001 | Dow | |
| 6,323,046 B1 | 11/2001 | Agarwal | |
| 6,338,667 B2 | 1/2002 | Sandhu et al. | |
| 6,350,179 B2 | 2/2002 | Campbell et al. | |
| 6,362,105 B1 | 3/2002 | Moore | |
| 6,364,742 B1 | 4/2002 | Fukuzawa | |
| 6,364,746 B2 | 4/2002 | Moore | |
| 6,461,964 B2 | 10/2002 | Hofmann et al. | |
| 6,464,560 B2 | 10/2002 | Sandhu et al. | |
| 6,464,561 B2 | 10/2002 | Sandhu et al. | |
| 6,464,564 B2 | 10/2002 | Sandhu et al. | |
| 6,464,824 B1 | 10/2002 | Hofmann et al. | |
| 6,468,912 B2 | 10/2002 | Hofmann et al. | |
| 6,472,325 B2 | 10/2002 | Hofmann et al. | |
| 6,488,566 B2 | 12/2002 | Sandhu et al. | |
| 6,492,273 B1 | 12/2002 | Hofmann et al. | |
| 6,503,839 B2 | 1/2003 | Gonzales et al. | |
| 6,517,412 B2 | 2/2003 | Lee et al. | |
| 6,517,668 B2 | 2/2003 | Agarwal | |
| 6,520,834 B1 | 2/2003 | Marshall | |
| 6,540,588 B2 | 4/2003 | Moore | |
| 6,540,591 B1 | 4/2003 | Pasadyn et al. | |
| 6,595,830 B1 | 7/2003 | Hewett et al. | |
| 6,623,333 B1 | 9/2003 | Patel et al. | |
| 6,669,539 B1 | 12/2003 | Amartur | |
| 6,676,482 B2 | 1/2004 | Bibby et al. | |
| 6,746,958 B1 | 6/2004 | Hewett et al. | |
| 6,764,379 B2 | 7/2004 | Farinov | |
| 6,776,692 B1 | 8/2004 | Zuniga et al. | |
| 6,799,136 B2 | 9/2004 | Patel et al. | |
| 6,939,198 B1 | 9/2005 | Swedek et al. | |
| 7,097,534 B1 | 8/2006 | Yampolsky | |
| 7,101,251 B2 | 9/2006 | Swedek et al. | |
| 7,195,540 B2 | 3/2007 | Finarov | |
| 7,207,871 B1 | 4/2007 | Zuniga et al. | |
| 7,294,039 B2 | 11/2007 | Swedek et al. | |
| 7,585,202 B2 | 9/2009 | Swedek et al. | |
| 7,927,182 B2 | 4/2011 | Swedek et al. | |
| 8,460,057 B2 | 6/2013 | Swedek et al. | |
| 10,357,867 B2 | 7/2019 | Lin et al. | |
| 11,282,755 B2 | 3/2022 | Lau et al. | |
| 2002/0155789 A1 | 10/2002 | Bibby et al. | |
| 2004/0082271 A1 | 4/2004 | Wiswesser et al. | |
| 2004/0249614 A1 | 12/2004 | Finarov | |
| 2005/0020185 A1 | 1/2005 | Bibby et al. | |
| 2005/0245170 A1 | 11/2005 | Swedek et al. | |
| 2006/0286904 A1 | 12/2006 | Swedek et al. | |
| 2008/0064300 A1 | 3/2008 | Swedek et al. | |
| 2008/0206993 A1 | 8/2008 | Lee et al. | |
| 2010/0062684 A1 | 3/2010 | Swedek et al. | |
| 2010/0185314 A1 | 7/2010 | Xu et al. | |
| 2011/0195528 A1 | 8/2011 | Swedek et al. | |
| 2012/0184189 A1* | 7/2012 | Kim | B24B 37/30 451/388 |
| 2014/0015107 A1 | 1/2014 | Chen et al. | |
| 2014/0242883 A1* | 8/2014 | Cherian | B24B 49/12 451/6 |
| 2014/0277670 A1 | 9/2014 | Zhang et al. | |
| 2015/0224623 A1 | 8/2015 | Xu et al. | |
| 2015/0321312 A1 | 11/2015 | Zhang et al. | |
| 2016/0016279 A1 | 1/2016 | Gurusamy et al. | |
| 2016/0074989 A1 | 3/2016 | Fukushima et al. | |
| 2017/0001281 A1 | 1/2017 | Corsi et al. | |
| 2017/0256414 A1 | 9/2017 | Liu et al. | |
| 2017/0312881 A1* | 11/2017 | Lin | H01L 21/67703 |
| 2018/0061032 A1* | 3/2018 | Benvegnu | G06T 7/0006 |
| 2018/0099374 A1 | 4/2018 | Shen et al. | |
| 2018/0264619 A1* | 9/2018 | Yoshida | B24B 49/105 |

FOREIGN PATENT DOCUMENTS

| | | |
|---|---|---|
| JP | 2017-527107 | 9/2017 |
| WO | WO 2013/077145 | 5/2013 |

OTHER PUBLICATIONS

Office Action in Taiwanese Appln. No. 109128874, dated May 17, 2021, 13 pages (with English translation).

Office Action in Japanese Appln. No. 2022-513265, dated May 9, 2023, 6 pages (with English translation).

* cited by examiner

ASYMMETRY CORRECTION VIA ORIENTED WAFER LOADING

CROSS-REFERENCE TO RELATED APPLICATIONS

This application is a divisional of and claims the benefit of priority to U.S. application Ser. No. 16/552,456, filed on Aug. 27, 2019, the contents of which are hereby incorporated by reference.

TECHNICAL FIELD

This disclosure relates to chemical mechanical polishing (CMP).

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, a chemical mechanical polishing system includes a metrology station having a sensor configured to measure a thickness profile of a substrate, a robotic arm configured to transfer the substrate from the metrology station to a polishing station having, a platen to support a polishing pad having a polishing surface, a carrier head on the polishing surface, the carrier head having a membrane configured to apply pressure to the substrate in the carrier head, and a controller configured to receive measurements from the sensor and configured to control the robotic arm to orient the substrate in the carrier head according to substrate profile and a removal profile for the carrier head.

Implementations of any of the above aspects may include one or more of the following features.

A retaining ring can enclose the substrate in the carrier head. A diameter of the substrate can be one to three mm less than an inner surface diameter of the retaining ring.

The sensor can be a camera.

The sensor can be configured to perform a line scan.

The carrier head can have one or more markers indicative of the carrier head orientation.

The substrate can have one or more markers that are indicative of the substrate orientation. The marker can be a notch or a flat on the substrate.

The controller can assign a marker indicative of the substrate orientation.

A pedestal of the metrology station can support the substrate.

In another aspect, a method for chemical mechanical polishing includes measuring a first substrate thickness, determining a first substrate thickness profile from the measured thickness, transferring the first substrate to a carrier head and loading the first substrate in the carrier head, wherein the first substrate and the carrier head are in a zero-position, polishing the first substrate, measuring the first substrate polished thickness, determining the first substrate polished thickness profile from the measured polished thickness, calculating a removal profile due to the carrier head by comparing the first substrate thickness profile and the first substrate polished thickness profile, measuring a second substrate thickness profile, rotating the carrier head to desired angle relative to the second substrate, wherein the orientation of the carrier head at a desired angle relative to the second substrate is configured to cause the removal profile to lower the second substrate thickness profile, transferring the second substrate to the carrier head and loading the second substrate in the carrier head, and polishing the second substrate.

Implementations of any of the above aspects may include one or more of the following features.

Retaining the first substrate and the second substrate in the carrier head using a retaining ring.

A sensor can be used to measure the first substrate thickness, the first substrate polished thickness, and the second substrate thickness. The sensor can be a camera. The sensor can be used to perform a line scan.

A marker on the carrier head can be aligned with a marker on the first substrate. The marker on the first substrate can be a notch or flat of the first substrate.

A marker on the carrier head can be aligned at an angle relative to a marker on the second substrate. The marker on the second substrate can be a notch or flat of the second substrate.

Advantages of the foregoing may include, but are not limited to, the following. Substrate asymmetry can be reduced by orienting a substrate in a carrier head to at least partially cancel out the substrate's asymmetric thickness profile using the carrier head's removal profile. This can improve within-wafer uniformity and wafer-to-wafer uniformity.

The details of one or more implementations are set forth in the accompanying drawings and the description below. Other aspects, features, and advantages will be apparent from the description and drawings, and from the claims.

DETAILED DESCRIPTION

In some polishing systems, a membrane in a carrier head is used to apply pressure on a substrate during polishing.

However, even if the carrier head is operated in a manner intended to apply uniform pressure on the substrate, the substrate can be subjected to an asymmetric removal profile, i.e., the amount removed varies with the angular position around the center of the substrate (rather than only with the radial distance from the center). This asymmetry could occur due to process variations across the substrate or pressure differences from the carrier head that occur even if a chamber in the carrier head is uniformly pressurized. Also, prior to being polished, the substrate can have an initial asymmetrically non-uniform thickness profile. The asymmetric removal profile, combined with the substrate's initial asymmetric thickness profile can result in a polished substrate having a final thickness profile that is highly asymmetric.

One solution to address this is to determine the carrier head's particular removal profile, and orient the substrate in the carrier head such that the removal profile and the substrate's thickness profile at least partially cancel each other out, thus reducing asymmetry in the final thickness profile.

Figure 1:
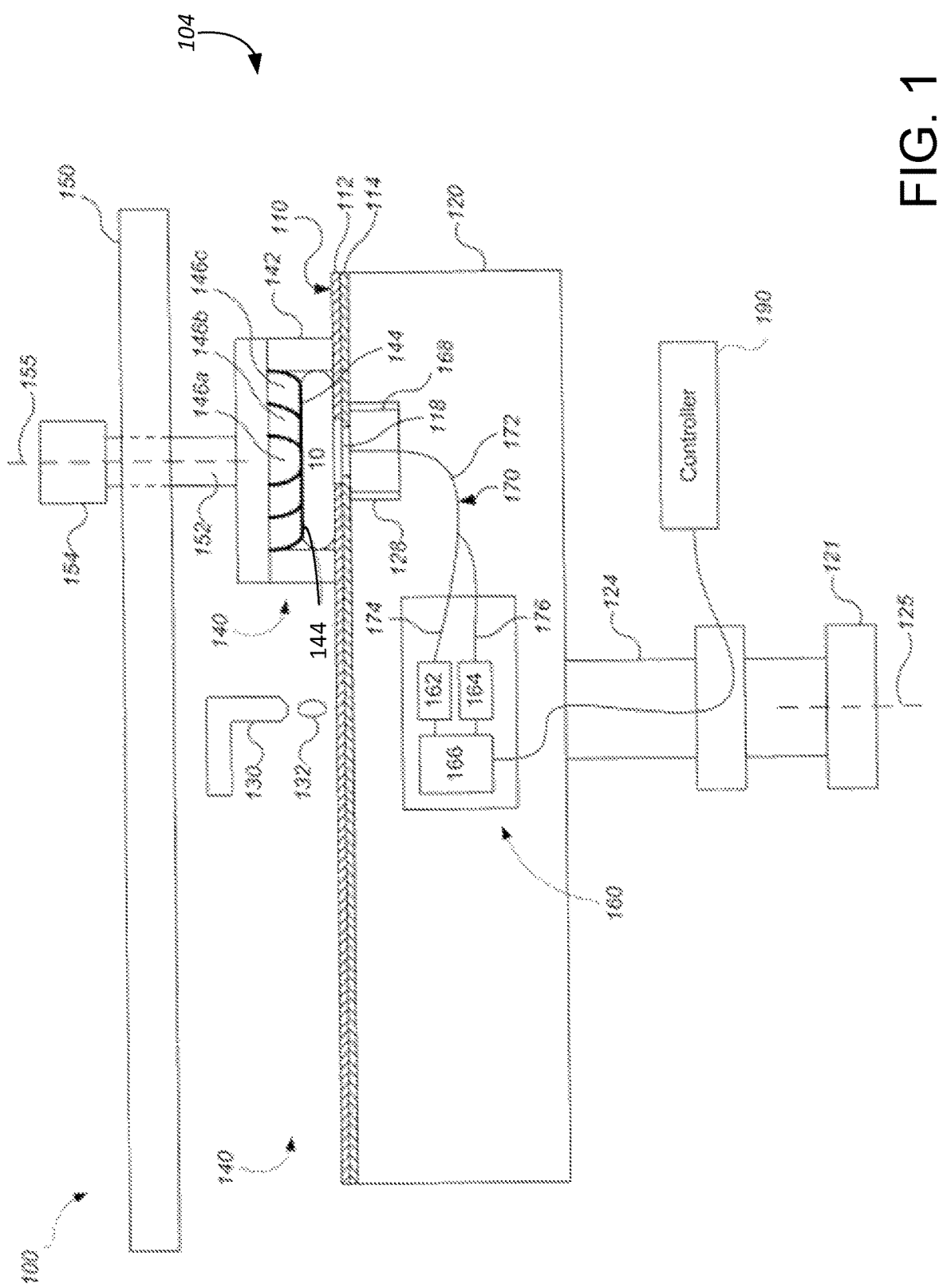
FIG. 1 is a schematic cross-sectional view of a polishing system.

FIG. 1 illustrates an example of a polishing system 100 that includes a polishing apparatus 104. The polishing apparatus 104 includes one or more carrier heads 140 (only one shown). Each carrier head 140 is operable to hold a substrate 10, such as a wafer, against the polishing pad 110. Each carrier head 140 can have independent control of the polishing parameters, for example pressure, associated with each respective substrate. Each carrier head 140 includes a retaining ring 142 to hold the substrate 10 in position on the polishing pad 110 and below a flexible membrane 144.

Each carrier head 140 can optionally include a plurality of independently controllable pressurizable chambers defined by the membrane, e.g., three chambers 146a-146c, which can apply independently controllable pressures to associated zones on the flexible membrane 144 and thus on the substrate 10.

Each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the support structure 150; by rotational oscillation of the carousel itself, or by motion of a carriage that supports the carrier head 140 along the track.

The platen 120 included in the polishing apparatus 104 is a rotatable disk-shaped platen on which the polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 104 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

In operation, the platen 120 is rotated about its central axis 125, and each carrier head 140 is rotated about its central axis 155 and translated laterally across the top surface of the polishing pad. In general, rotation of the carrier head 140 results in rotation of the substrate 10 at the same rotation rate. Without being limited to any particular theory, although the substrate is not "stuck" to the membrane 144 in the carrier head 140, friction of the inner surface of the rotating retaining ring 142 against the edge of the substrate 10 can result in an equal rotation rate of the substrate 10.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ monitoring system 160. The in-situ monitoring system can be an optical monitoring system, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118. The in-situ monitoring system can alternatively or in addition include an eddy current monitoring system.

In some implementation, the optical monitoring system 160 is an in-sequence optical monitoring system having a probe (not shown) positioned between two polishing apparatuses or between a polishing apparatus and a transfer station. The monitoring system 160 can continuously or periodically monitor one or more features of the zones of the substrate during polishing. For example, one feature is a thickness of each zone of the substrate.

In either the in-situ or in-sequence embodiments, the optical monitoring system 160 can include a light source 162, a light detector 164, and circuitry 166 for sending and receiving signals between a remote controller 190, e.g., a computer, and the light source 162 and light detector 164. One or more optical fibers 170 can be used to transmit the light from the light source 162 to the optical access in the polishing pad, and to transmit light reflected from the substrate 10 to the detector 164.

Figure 2:
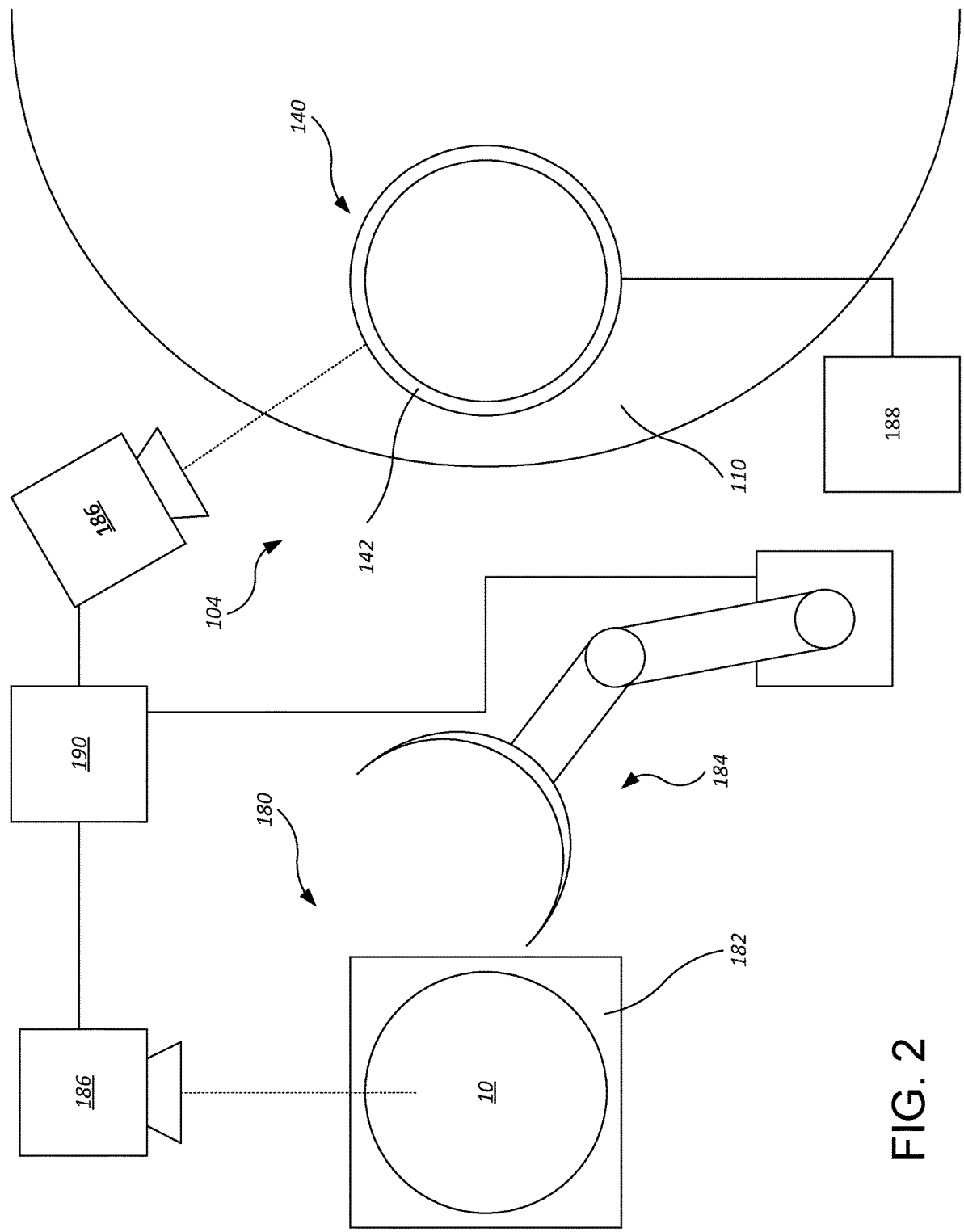
FIG. 2 is a schematic view of a substrate loading station and metrology station and the polishing system.
Figure 3:
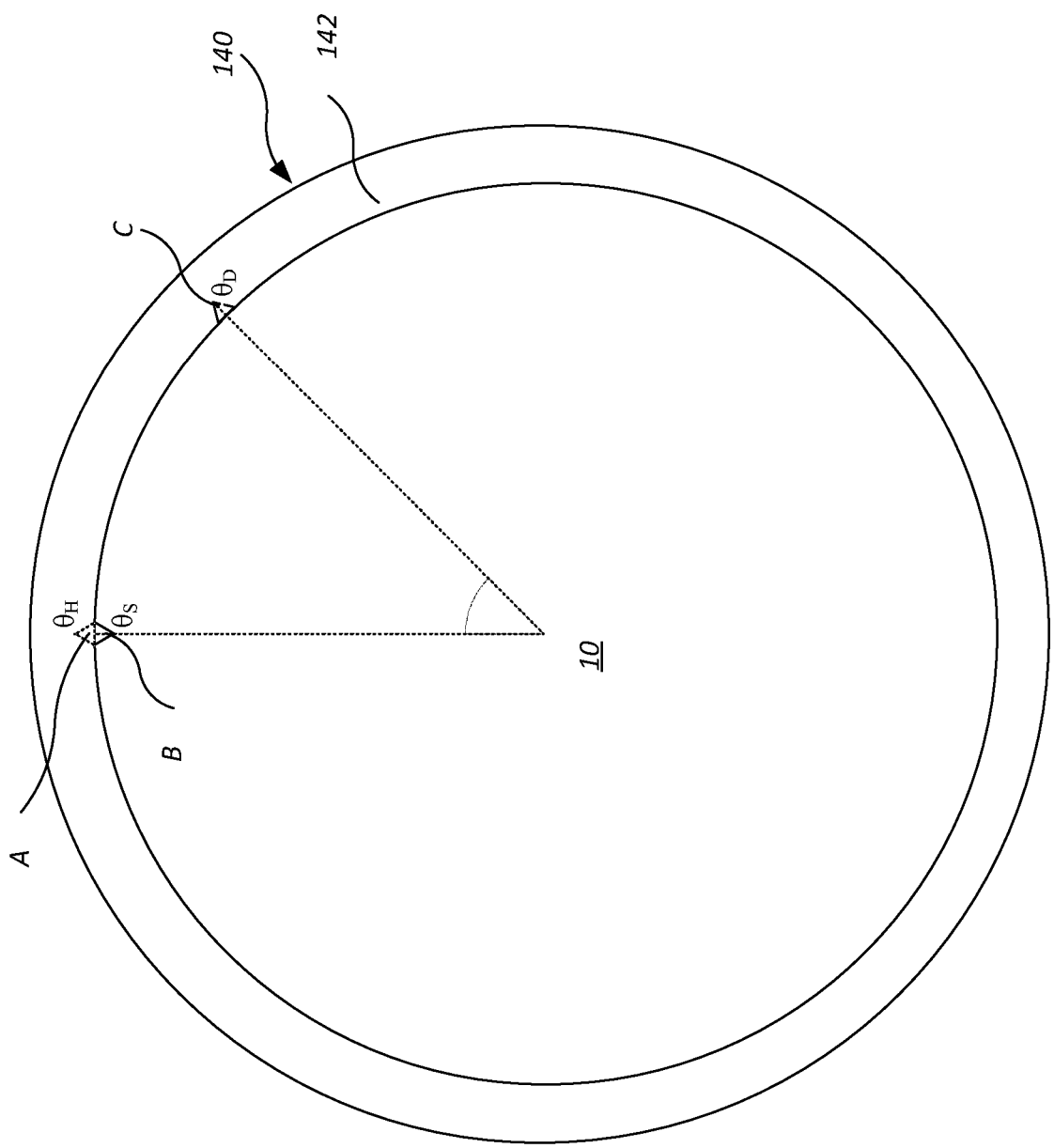
FIG. 3 is a schematic top-view of a substrate oriented in a carrier head of the polishing system.

Referring to FIGS. 1-3, the carrier head 140 is configured to tightly enclose the substrate 10 at its edges, e.g., a diameter of the substrate 10 is one to three mm less than a diameter of an inner surface of the retaining ring 142 of the carrier head 140. As the substrate 10 is polished in the carrier head 140, the edge of the substrate 10 (e.g., a leading edge of the substrate 10) rolls against an inner surface of the carrier head 140, e.g., against an inner surface of the retaining ring 142. The substrate 10 can roll against the inner surface of the carrier head 140 (e.g., against the inner surface of the retaining ring 142) due to friction between the leading edge of the substrate 10 and friction of the inner surface of the carrier head 140 such that the substrate 10 rotates as the carrier head 140 rotates. Hypothetically, rotation of the substrate 10 would even out asymmetric polishing effects, e.g., due to differences in relative velocity between regions closer or farther from the axis of rotation of the platen. In practice however, because the substrate remains in a generally fixed angular position relative to the carrier head, the substrate 10 can be subject to a removal profile that is unique to the carrier head 140. The removal profile of the carrier head can be determined, e.g., empirically measured as discussed below, and then stored for use in selecting an orientation of the substrate upon loading.

Referring to FIGS. 2 and 3, prior to being loaded into the carrier head 140 and polished by the polishing apparatus 104, a pre-polishing thickness profile of the substrate 10 is determined. To determine the pre-polishing thickness profile, the substrate 10 can be loaded on a pedestal 182 of a metrology station 180. A sensor 186 is configured to measure a thickness of the substrate 10, e.g., a thickness (including a difference in thickness) of an outermost layer deposited on the substrate. The thickness of the substrate 10 can be measured at a plurality of locations in a two-dimension array across the substrate 10. The sensor 186 can be, for example, a camera or other similar metrology device configured to scan the substrate 10. For example, the sensor 186 can perform a line scan of the substrate 10 to generate a two-dimension color image of the substrate. The sensor 186 can generate thickness measurements, or generate measurements that scale linearly with thickness.

To measure the thickness of the substrate 10, the sensor 186 can measure selected spots in a circle around the center of the substrate 10, e.g., at the same radial distance from the center of the substrate 10. For example, the pedestal 182 can rotate so that the sensor 186 scans a circular path on the substrate 10. In some implementations, the sensor 186 can take measurements at multiple angular positions around the center of the substrate, and at multiple radial distances from the center of the substrate 10; these can provide an angular profile in circles of multiple different radii on the substrate 10. Alternatively, the sensor 186 can make measurements in a regular array, e.g., rectangular array, across the substrate 10 to form a two-dimension array of thicknesses of the substrate 10.

The sensor 186 measurements can be sent to the controller 190, which can then process the measurements to generate a thickness profile of the substrate 10. For example, the measurements can be combined to generate a thickness profile, e.g., an angular thickness profile, of the substrate 10. The angular thickness profile can indicate a thickness of the substrate 10 at different angular positions about the center of the substrate 10. For example, for each of a plurality of angles about center of the substrate 10, the angular thickness profile can indicate average thickness values at a radial distance from the center of the substrate 10. The angular thickness profile can also indicate a thickness of the substrate at different angular positions for multiple different radial distances from the center of the substrate 10. Alternatively, the thickness profile can be the two-dimension array of thicknesses of the substrate 10 as measured by the sensor 186 and generated by the controller 190.

After determining the thickness profile of the substrate 10, a desired orientation for the substrate 10 in the carrier head 140 is calculated. As noted above, the controller 190 can store the removal profile of the carrier head 140. For example, the controller 190 can store a plurality of a thickness removal values as a function of angle about the center of the substrate.

The substrate 10 can be positioned in the carrier head 140 such that the asymmetry in the final thickness profile is at least partially cancelled by the asymmetry in the removal profile of the carrier head. The controller can be configured to determine the desired relative orientation $\theta_D$ of the substrate 10 to the carrier head 140 based on the known removal profile $R_H(\theta)$ of the carrier head 140, and the pre-polishing thickness profile $R_S(\theta)$ of the substrate 10. For example, an angular difference AO can be incremented across a range, e.g., every 1 degree, or every 5 degrees, between 0 and 360 degrees. At each value of $\Delta\theta$, a total difference between the known removal profile $R_H(\theta)$ and the pre-polishing thickness profile $R_S(\theta)$ is calculated. The total difference can be calculated as a sum of squared differences, e.g., $$\sum_{\theta=0}^{360} [R_S(\theta) - R_H(\theta + \Delta\theta)]^2$$

although other difference metrics such as a sum of absolute values of differences can be used.

The desired angle $\theta_D$ is to be equal to the value of $\Delta\theta$ that provides the minimum value for the total difference.

The carrier head can be rotated to have the desired angle $\theta_D$, relative to the substrate. In other words, the carrier head 140 can be rotated to an angle where the removal profile of the carrier head 140 and the pre-polishing thickness profile of the substrate 10 are complementary. For example, the carrier head 140 can be rotated relative to the substrate 10 so that during polishing, a portion of the removal profile where removal is at its greatest can correspond to the thickest portion of the pre-polishing thickness profile.

To place the substrate 10 in a desired orientation in the carrier head 140, the desired relative angle $\theta_D$ between the carrier head 140 and the substrate 10 is calculated as described above.

The absolute angular position $\theta_P$ of the substrate 10 (e.g., relative to the fixed frame of the polishing apparatus) is measured. The measurement can be made by the sensor 186 when the substrate 10 is on the pedestal 182. For example, the measurement can made using an optical sensor that can detect a marker on the substrate 10, such as a notch or a flat (e.g., B in FIG. 3). Based on the absolute angular position of the substrate on the pedestal, the controller can calculate what the absolute angular position $\theta_S$ of the substrate will be when it is loaded into the carrier head 140. The difference between $\theta_P$ and $\theta_S$ can be determined based on the predetermined motion of the robot 184 when it moves the substrate from the pedestal 182 to the carrier head 140, e.g., if the robot 184 rotates the substrate 10 through a 90° or 180° angle when moving the substrate.

The absolute angular orientation $\theta_H$ of the carrier head can be measured, e.g., by optically detecting a marker (e.g., position A or C) on the carrier head 140, or using a motor encoder 188 that measures the carrier head 140 rotation.

Once the absolute angular position $\theta_S$ of the substrate 10 and the desired relative angle $\theta_D$ between the substrate 10 and carrier head 140 are determined, the carrier head 140 is rotated to an absolute angular orientation that provides a desired angle $\theta_D$ relative to the substrate 10, e.g., $\theta_H = \theta_S + \theta_D$. The controller 190 can be used to rotate the carrier head 140 to the appropriate angular orientation using feedback from the encoder or optical monitor.

The controller 190 can then causes a robotic arm 184 to transfer the substrate 10 from the metrology station 180 (e.g., from the pedestal 182) to the carrier head 140.

When the substrate 10 is loaded in the carrier head 140, polishing of the substrate 10 in the carrier head 140 results in a polished profile with lower asymmetry, because the removal profile of the carrier head reduces the asymmetry of the thickness profile of the substrate 10.

A test substrate can be used to determine the removal profile of the carrier head 140. First, the sensor 186 can measure a pre-polishing thickness profile of the test substrate prior to loading the test substrate in the carrier head 140. For example, the pre-polishing thickness profile of the test substrate can be measured at the metrology station 180. Then, using the robotic arm 184, the test substrate can be transferred from the metrology station 180 and loaded into the carrier head 140, where both are in a "zero-position" (or other known position and orientation) relative to one another. For example, position marker B of the test substrate and position marker A of the carrier head 140 can be aligned. The test substrate can then be polished in the carrier head 140. Following polishing, the test substrate can be transferred from the carrier head 140 to the metrology station 180 using the robotic arm 184, where a post-polishing thickness profile of the test substrate can be measured. Then, the removal profile of the carrier head 140 can be calculated by comparing the thickness profile of the test substrate prior to and after polishing, e.g., subtracting the pre-polishing thickness profile from the post-polishing thickness profile.

As the carrier head 140 wears down, the carrier head 140 can be replaced. The replacement carrier head 140 will also have a unique removal profile. To measure and calibrate the removal profile of each carrier head 140, a substrate (e.g., a test substrate for each replacement carrier head 140) can be polished to determine the removal profile of the carrier head 140. Comparison of the thickness profile and the polished profile can determine the removal profile of the carrier head 140. For example, the controller 190 compares the measurements of the thickness profile of the substrate 10 prior to polishing in the carrier head 140 with the polished thickness profile of the substrate 10 after polishing in the carrier head 140. Comparing the thickness profile and the polished profiles of the substrate 10 reveals the removal profile due to the carrier head 140 (for example, due to radial distribution of pressure in the carrier head 140).

The controller and other computing devices which are part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of embodiments of the invention have been described. Nevertheless, it will be understood that various modifications may be made without departing from the spirit and scope of the invention. Accordingly, other implementations are within the scope of the following claims.

What is claimed is:

1. A method for chemical mechanical polishing, comprising:
    receiving, by a controller of a chemical mechanical polishing (CMP) apparatus, an angular removal profile for a carrier head and an angular thickness profile of a substrate;
    prior to polishing the substrate, selecting a desired angle of the carrier head relative to the substrate for loading the substrate into the carrier head, wherein selecting the desired angle is performed based on a comparison of the angular removal profile for the carrier head and the angular thickness profile of the substrate to reduce angular non-uniformity in polishing;
    detecting, while the substrate in a measuring position on a metrology station of the CMP apparatus and prior to loading the substrate into the carrier head, an angular orientation of the substrate;
    rotating the carrier head to receive the substrate at the desired angle;
    transferring, by a predetermined motion of one or more robots of the CMP apparatus that transfer the substrate from an measuring position into the carrier head, the substrate to the carrier head and loading the substrate into the carrier head with the carrier head at the desired angle relative to the substrate;
    calculating an absolute angular position of the substrate upon loading into the carrier head, the calculating based on i) the angular orientation of the substrate prior to loading and ii) an amount of rotation from the predetermined motion of the one or more robots; and
    polishing the substrate.

2. The method of claim 1, wherein selecting the desired angle includes calculating an angular asymmetry for a plurality of possible loading orientations and determining of one of the plurality of possible loading orientations having reduced angular asymmetry in final thickness profile relative to other possible loading orientations.

3. The method of claim 2, wherein calculating the angular asymmetry comprises, for each angular difference of a plurality of angular differences, calculating a total thickness difference between the angular removal profile and the angular thickness profile using the angular difference as angular offset between the angular removal profile and the angular thickness profile.

4. The method of claim 3, comprising calculating the total thickness difference as a sum of least squared differences between the angular removal profile and the angular thickness profile.

5. The method of claim 3, comprising selecting an angular difference from the plurality of angular differences that has a minimum total thickness difference.

6. The method of claim 1, wherein rotating the carrier head to the desired angle comprises rotating the carrier head an amount based on the angular orientation of the substrate and the desired angle.

7. The method of claim 1, wherein rotating the carrier head to the desired angle comprises rotating the carrier head an amount based on the absolute angular position of the substrate and the desired angle.

8. The method of claim 1, wherein detecting the angular orientation of the substrate includes detecting a marker on the substrate.

9. The method of claim 8, wherein the marker is a notch or flat of the substrate.

10. The method of claim 1, comprising:
    measuring a pre-polishing angular thickness profile of a test substrate;
    loading the test substrate into the carrier head with the carrier head in a zero-position relative to the test substrate, the zero-position being a rotational orientation of the test substrate within the carrier head such that a pre-determined angular position of the test substrate is aligned with a pre-determined angular position of the carrier head;
    polishing the test substrate;
    measuring a post-polishing angular thickness profile of the test substrate;

calculating an angular removal profile of the carrier head by comparing the pre-polishing angular thickness profile and the post-polishing angular thickness profile.

11. The method of claim 1, further comprising holding the substrate with a retaining ring that has an inner surface diameter one to three mm greater than an outer diameter of the substrate.

12. The method of claim 1, comprising measuring the angular thickness profile of the substrate at an in-sequence metrology station.

13. The method of claim 12, wherein measuring the angular thickness profile comprises imaging the substrate with a camera.

* * * * *